US008618858B2

(12) United States Patent
Kim et al.

(10) Patent No.: US 8,618,858 B2
(45) Date of Patent: Dec. 31, 2013

(54) PULSE GENERATOR AND METHOD FOR GENERATING PULSE

(75) Inventors: Jae Hwan Kim, Daejeon-si (KR); Hyung Soo Lee, Daejeon-si (KR); Sang Sung Choi, Daejeon-si (KR); Kyeong Deok Moon, Daejeon-si (KR); Yun Ho Choi, Ulsan-si (KR); Young Su Kim, Ulsan-si (KR); Franklin Bien, Ulsan-si (KR)

(73) Assignees: Electronics and Telecommunications Research Institute, Daejeon-si (KR); Unist Academy—Industry Corporation, Ulsan-si (KR)

( * ) Notice: Subject to any disclaimer, the term of this patent is extended or adjusted under 35 U.S.C. 154(b) by 39 days.

(21) Appl. No.: 13/309,769

(22) Filed: Dec. 2, 2011

(65) Prior Publication Data

US 2012/0139598 A1    Jun. 7, 2012

(30) Foreign Application Priority Data

Dec. 3, 2010    (KR) .................. 10-2010-0122708

(51) Int. Cl.
*G06F 1/04*    (2006.01)

(52) U.S. Cl.
USPC ........... 327/291; 327/172; 327/173; 327/174; 327/175; 327/176; 327/293; 327/294

(58) Field of Classification Search
USPC .................. 327/172–176, 291, 293, 294, 299
See application file for complete search history.

(56) References Cited

U.S. PATENT DOCUMENTS

| 7,746,144 | B2 * | 6/2010 | Jimenez et al. | 327/299 |
| 2002/0047739 | A1 * | 4/2002 | Mace | 327/291 |
| 2009/0058490 | A1 * | 3/2009 | Ikeda | 327/291 |

OTHER PUBLICATIONS

Youngmin Park, et al; "IR-UWB Transmitters Synthesized from Standard Digital Library Components", Circuits and Systems (ISCAS), Proceedings of 2010 IEEE International Symposium on; May 30, 2010-Jun. 2, 2010; pp. 3296-3299.

* cited by examiner

*Primary Examiner* — Nguyen Tran
*Assistant Examiner* — Afework Demisse
(74) *Attorney, Agent, or Firm* — Ladas & Parry LLP

(57) ABSTRACT

A pulse generator is provided. The pulse generator includes: a time delayed pulse generation unit including a plurality of delay cells for receiving a first pulse having a first pulse width and outputting pulses delayed by a particular time delay value on the basis of one of a rising edge and a falling edge of the first pulse; an edge combiner configured to receive the plurality of time delayed pulses from the time delayed pulse generation unit and generate second pulses having a second pulse width; and a channel selector configured to regulate the number of outputs of the second pulses generated by the edge combiner.

13 Claims, 7 Drawing Sheets

PULSE GENERATOR AND METHOD FOR GENERATING PULSE

CROSS-REFERENCE TO RELATED APPLICATIONS

This application claims the benefit of priority of Korean Patent Application No. 10-2010-0122708 filed on Dec. 3, 2010 which is incorporated by reference in its entirety herein.

BACKGROUND OF THE INVENTION

1. Field of the Invention

The present invention relates to wireless communication and, more particularly, to an apparatus and method for generating a pulse.

2. Description of the Related Art

An impulse radio-ultra wide band (IR-UWB, referred to as 'UWB', hereinafter) communication system has been focused as a technique for reducing power and leading a short-range sensor network. Unlike the existing narrowband communication system using a super-heterodyne scheme, the UWB system uses a homodyne scheme based on a direct conversion in a baseband. Here, the super-heterodyne scheme, a scheme of employing low frequency amplification, is to converting a radio frequency (RF) signal into a lower intermediate frequency (IF) signal once, amplifying the converted IF signal, and demodulating the amplified signal, and the homodyne scheme is available for a direct conversion in a baseband. Thus, the UWB system does not require a frequency shifting process at a transmitter/receiver, so it is available for non-coherent communication. Also, the UWB system does not require a local oscillator (LO), a phase locked loop (PLL), and the like (which is called carrier free). The simple structure of the UWB system leads to a reduction in a material cost and fabrication cost, a reduction in size and power consumption to lengthen a life span of a battery, so the UWB system can be easily applied to a WPAN (wireless personal area network) and a WBAN (wireless body area network) as an application for a mobile device.

In order to achieve low power consumption, a core technology of the IR-UWB system, a novel method for generating a pulse signal is required. The related art all-digital pulse generator is implemented through a 65 nm CMOS (complementary metal oxide semiconductor) process which disadvantageously incurs a high cost. Thus, a pulse generator and a pulse generation method which may be able to exhibit maximum operational characteristics through a low-cost process such as 0.13 um CMOS process are required.

SUMMARY OF THE INVENTION

Therefore, an object of the present invention is to provide a pulse generation method capable of stably generating, by a pulse generator fabricated through a given process, frequency up to a limit level and selecting a desired frequency even when a low-cost process is used.

In order to accomplish the object, there is provided a pulse generator including: a time delayed pulse generation unit including a plurality of delay cells for receiving a first pulse having a first pulse width and outputting pulses delayed by a particular time delay value on the basis of one of a rising edge and a falling edge of the first pulse; an edge combiner configured to receive the plurality of time delayed pulses from the time delayed pulse generation unit and generate second pulses having a second pulse width; and a channel selector configured to regulate the number of outputs of the second pulses generated by the edge combiner.

The second pulse width may be equal to the particular time delay value and smaller than the first pulse width. The delay cells may output pulses delayed by the particular time delay value on the basis of the rising edge of the first pulse.

The pulse generator may further include: a delay control unit configured to regulate the particular time delay value of the delay cells. The delay control unit may regulate the particular time delay value by regulating the number of 3-state buffers operating in the respective delay cells included in the time delayed pulse generation unit.

The pulse generator may further include: a pulse elimination unit connected to the edge combiner, wherein the pulse elimination unit may receive the second pulses and the first pulse output from the edge combiner and eliminate a pulse generated by an edge other than the edge as the reference.

The second pulse width may be equal to any one of 143 ps (pico seconds), 125 ps, and 111 ps.

In order to accomplish the object, there is also provided a pulse generation method including: receiving a first pulse having a first pulse width and outputting a plurality of pulses delayed by a particular time delay value on the basis of one of a rising edge and a falling edge of the first pulse; receiving the plurality of time delayed pulses and generating second pulses having a second pulse width; and regulating the number of outputs of the generated second pulses.

According to exemplary embodiments of the present invention, the pulse generator and the pulse generation method can obtain operational characteristics close to a limit level in a low-cost CMOS process and are advantageous for a generation of a burst pulse, so the pulse generator and the pulse generation method according to exemplary embodiments of the present invention can be effectively applicable to a non-coherent IR-UWB system. Also, the pulse generator can be appropriate for a WPAN, a WBAN, or the like, that requires low power consumption and small size.

The foregoing and other objects, features, aspects and advantages of the present invention will become more apparent from the following detailed description of the present invention when taken in conjunction with the accompanying drawings.

DETAILED DESCRIPTION OF THE INVENTION

A term of ultra wide band (UWB) relates to (or results from) spectrum characteristics according to an exemplary embodiment of the present invention. When bandwidth is more than 25% of a center frequency, it is defined as UWB, when bandwidth ranges from 1% to 25%, it is defined as wide band (WB), and when bandwidth is smaller than 1%, it is defined as a narrow band. The UWB technique is a low power high speed radio communication technique available for transmission up to 400 mega bits to 500 mega bits per second. The UWB technique, which transmits an extremely short data pulse along with an ultra-low power radio signal, is appropriate for a relatively short range communication. The UWB uses a very short pulse of about 2 ns or smaller and has an ultra-wide band over a few GHz (3.1 GHz to 10.6 GHz) when viewed from a frequency axis. The use of such an ultra-short pulse for communication allows for a transmission of a signal at a low power level according to a low duty cycle and, in this case, the signal has the characteristics that it is resistant to multi-path noise. The UWB can be applied to an extensive range; it can be applied to radar for discovering an object under the ground or behind a wall and to a wireless data network available for a short-range high speed data transmission, and in particular, the UWB can be easily applied to a system such as a WPAN, a WBAN, and the like.

A transmission/reception end of the IR-UWB system is a non-coherent system for ultra-low power consumption. In the IR-UWB system, a local oscillator and a mixer consume a great deal of power, so the replacement of the local oscillator and the mixer with other parts that consume less power would obtain a very large power gain. A currently, an all-digital pulse generator is an element that comes into prominence. The all-digital pulse generator generates a pulse in an all-digital manner, rather than using an analog amplifier. In this case, a center frequency can be determined by a delay cell, without a local oscillator, and energy consumption (energy consumption calculated by $CV^2$, wherein C is capacitance and V is voltage) is made only by capacitance and a sub-threshold leakage. Because an analog amplifier is not required, the all-digital pulse generator can easily obtain ultra-low power consumption.

In the IR-UWB system, the all-digital pulse generator does not use a local oscillator or a mixer as core parts, and a method for implementing the all-digital pulse generator is directly connected with performance and low cost of the IR-UWB system.

Figure 1:
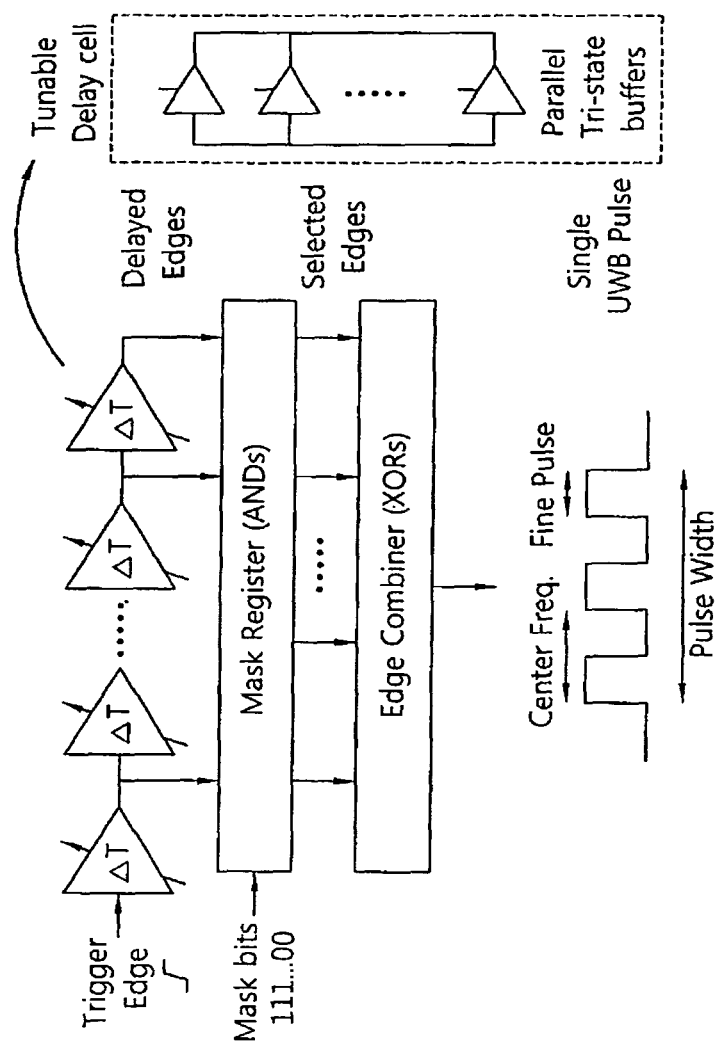
FIG. 1 is a view illustrating an example of a general all-digital pulse generator according to the related art.

FIG. 1 is a view illustrating an example of a general all-digital pulse generator according to the related art.

With reference to FIG. 1, in the related art general all-digital pulse generator, when a PPM (Pulse Position Modulation)-modulated pulse is input, an input signal delayed by a desired amount of time by using a delay cell is generated. A desired number of rising edges and falling edges of the time-delayed input signals are output through a to mask register using an AND gate, and an impulse signal used for communication is generated through an edge combiner using an XOR gate tree. The edges of the pulses which have passed through the XOR gate have a fine pulse width having a duty cycle by the delayed time interval and a center frequency of the impulse signal is determined. Here, the fine pulse refers to a single pulse. The mask register regulates the bandwidth of the generated impulse signal by determining the number of fine pulses. The related art all-digital pulse generator is fabricated largely through a 65 nm CMOS process.

Figure 2:
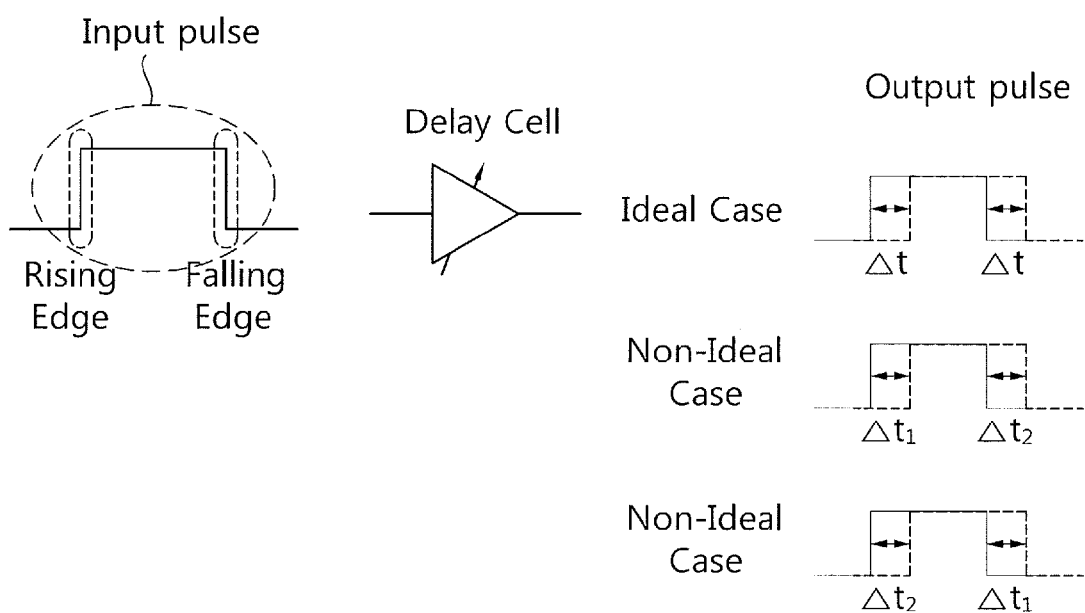
FIG. 2 is a view illustrating a rising edge and a falling edge of a pulse signal and output pulse signals generated as the pulse signal passes through a delay cell.

FIG. 2 is a view illustrating a rising edge and a falling edge of a pulse signal and output pulse signals generated as the pulse signal passes through a delay cell.

With reference to FIG. 2, a pulse signal, namely, an input pulse, includes a rising edge and a falling edge. When the input pulse passes through a delay cell, in an ideal case, the rising edge and the falling edge of the input pulse are delayed by the same time and then output. For a high frequency, the time delay value of the rising edge and the falling edge must be regulated with a very small value, and in this case, delaying of the rising edge and the falling edge of the input pulse by the same time is difficult realistically and incurs a high cost. Namely, in a non-ideal case, as shown in FIG. 2, the rising edge and the falling edge of the input pulse are time-delayed with different values. This phenomenon may occur when a delay cell is fabricated by using a low-cost process such as a 0.13 um CMOS process, which may be problematic.

Figure 3:
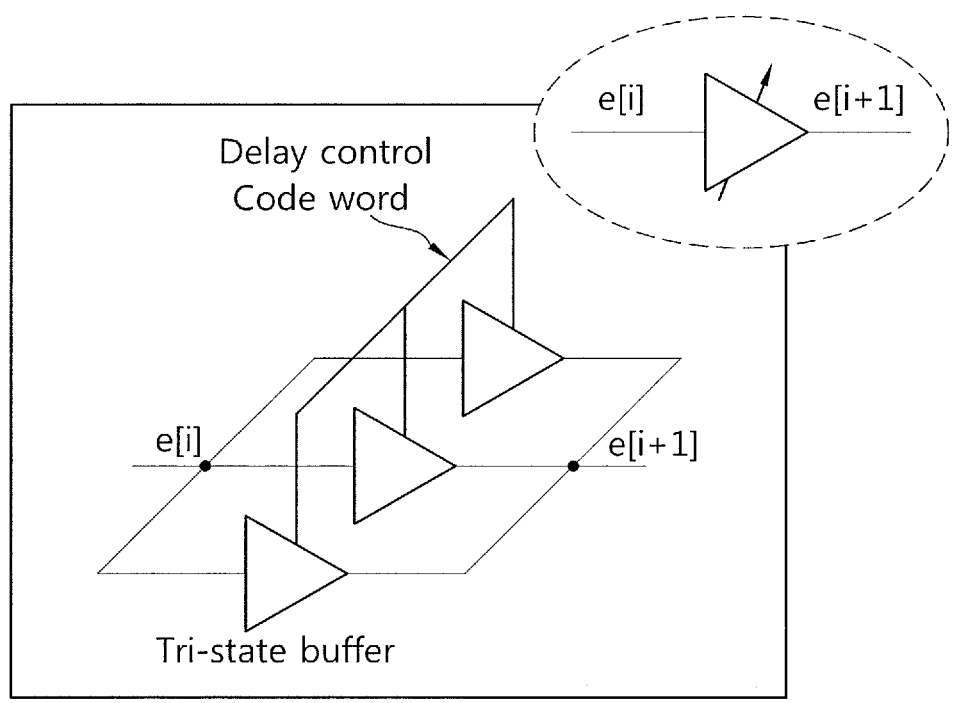
FIG. 3 is a view illustrating the structure of delay cells.

FIG. 3 is a view illustrating the structure of delay cells.

With reference to FIG. 3, one delay cell is configured by connecting a plurality of 3-state buffers in parallel. When a pulse signal (e[i]) is input to the delay cell, an output pulse signal (e[i+1]) having a delay time as represented by Equation 1 shown below:

$$\Delta t(n) \propto \frac{C_1 \times N_{tot}}{n} + C_2 \qquad \text{[Equation 1]}$$

$N_{tot}$: the number of buffers $n$: the number of buffers turned on $C_1, C_2$: physical parameters Here, $N_{tot}$ is the number of 3-state buffers, n is the number of buffers turned on, and $C_1$ and $C_2$ are physically determined parameters. Namely, a delay time of the pulse input to the delay cell may be regulated by using the total number of the 3-state buffers connected in parallel and the number of 3-state buffers turned on. The number of 3-state buffers turned on may be regulated through a delay control codeword.

In the present exemplary embodiment, a rising edge having a delay time between 90 ps and 160 ps may be generated by optimizing only the delay time with respect to one of the rising edge and the falling edge of the pulse signal. This case corresponds to a low band of the UWB frequency.

Figure 4:
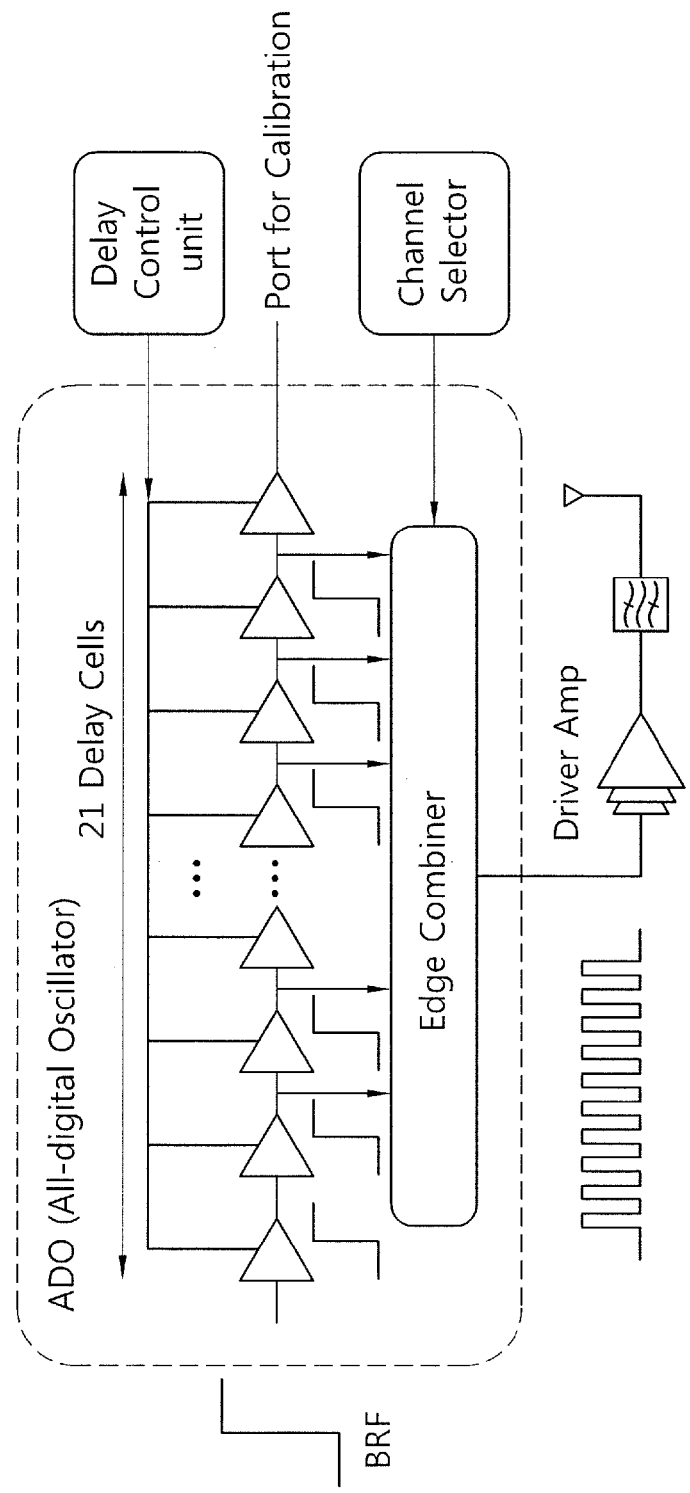
FIG. 4 is a schematic block diagram of an all-digital pulse generator according to an exemplary embodiment of the present invention.
Figure 5:
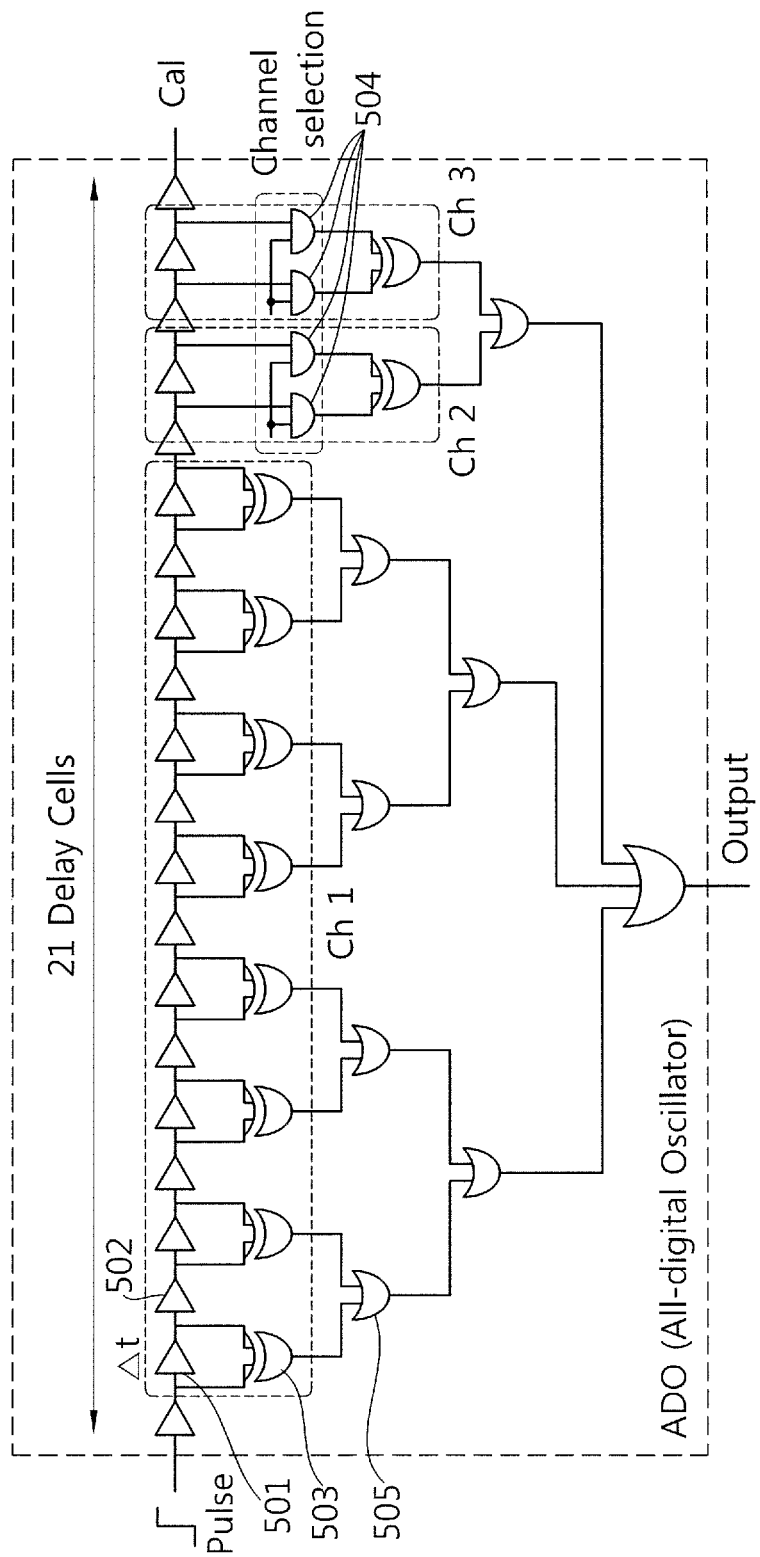
FIG. 5 is a view illustrating the structure of each block in the all-digital pulse generator according to an exemplary embodiment of the present invention.

FIG. 4 is a schematic block diagram of an all-digital pulse generator according to an exemplary embodiment of the present invention, and FIG. 5 is a view illustrating the structure of each block in the all-digital pulse generator according to an exemplary embodiment of the present invention.

With reference to FIGS. 4 and 5, the all-digital pulse generator may include a plurality of delay cells, a delay control unit, an edge combiner, and a channel selector.

The plurality of delay cells may be connected in series. In the present exemplary embodiment, twenty one delay cells are connected in series, but the present invention is not limited thereto and the number of delay cells may be variably modified. When a pulse signal is input to each of the delay cells, temporally delayed pulse signals (which are delayed by $\Delta t$) are output. The temporally delayed pulse signals are called output pulse signals.

The edge combiner receives the output pulse signals from the respective delay cells and generates fine pulses through an XOR gate. The respective fine pulses have the same width as that of the delay time of the delay cells. The fine pulses generated through the XOR gate form a pulse group including the plurality of fine pulses through an OR gate 505. The XOR gate may be used in the place of the OR gate 505, but the OR gate 505 is advantageous in that it can reduce a production cost because it uses a smaller number of transistors than that of the XOR gate.

The plurality of delay cells and the edge combiner may constitute an all-digital oscillator (ADO). When a PPM-modulated pulse signal having a relatively low frequency is input to the ADO, a total of twenty pulse signals, which have been delayed by the twenty one delay cells connected in series, are generated. In this case, the pulse signals input to the delay cells may have a first pulse width. The edge of the delayed pulse signals is directly delivered to the edge combiner block, without passing through the mask register of the related art, generating a total of ten fine pulses. The respective fine pulses have a second pulse width. In this case, the first pulse width may be greater than the second pulse width. The second pulse width may be set to fit the low band of the UWB frequency band and is equal to the delay time (Δt) of the delay cells.

The delay control unit is a block for regulating time delay values of the respective delay cells. As described above with reference to the foregoing Equation 1, the time delay values of the respective delay cells may be adjusted by regulating the number of 3-state buffers within the delay cells and the number of 3-state buffers which operate (i.e., which are turned on). For example, when the low band of the UWB frequency band is desired to be used, pulses can be generated to have different center frequencies according to the purposes such as a channel 1 (center frequency 3.496 GHz, Δt=143 ps), a channel 2 (center frequency 4,000 GHz, Δt=125 ps), and a channel 3 (center frequency 4,504 GHz, Δt=111 ps) by regulating the number of the turned-on 3-state buffers among the 3-state buffers of the delay cells through the delay control unit.

The channel selector is a block for generating a desired bandwidth by adjusting the number of fine pulses. For example, in order to create a bandwidth of about 500 MHz with respect to each channel, the channel selector may include eight fine pulses with respect to the channel 1, nine fine pulses with respect to the channel 2, and ten fine pulses with respect to the channel 3.

Figure 6:
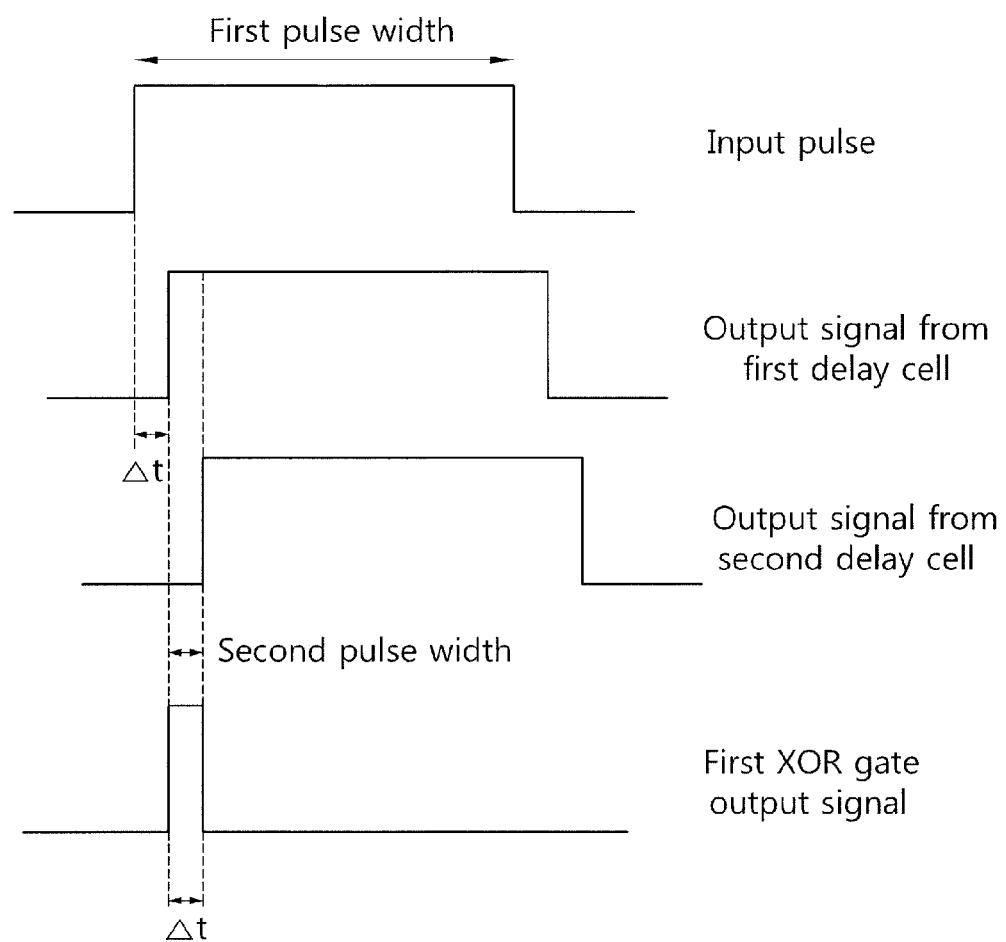
FIG. 6 is a view illustrating a pulse input to an ADO of FIG. 5, output pulses of delay cells, and signals generated after passing through an XOR gate of an edge combiner.

FIG. 6 is a view illustrating a pulse input to the ADO of FIG. 5, output pulses of delay cells, and signals generated after passing through an XOR gate of an edge combiner.

With reference to FIG. 6, when an input pulse having the first pulse width is input to a first delay cell (501 in FIG. 5), an output signal of the first delay cell having a certain time delay value Δt on the basis of a rising edge is generated. The output signal from the first delay cell is input to a second delay cell (502 in FIG. 5) connected in series to the first delay cell, and an output signal of the second delay cell time-delayed by the certain time delay value Δt compared with the output signal from the first delay cell is generated. The output signal from the first delay cell and the output signal from the second delay cell are input to a first XOR gate (503 in FIG. 5) of the edge combiner, generating one fine pulse having the second pulse width. This process is repeated in the same manner in the third and fourth delay cells and in the fifth and sixth delay cells, . . . , thus generating a total of ten fine pulses.

The channel selector can regulate the number of the fine pulses by adjusting the input value with respect to an AND gate (504 in FIG. 5).

Figure 7:
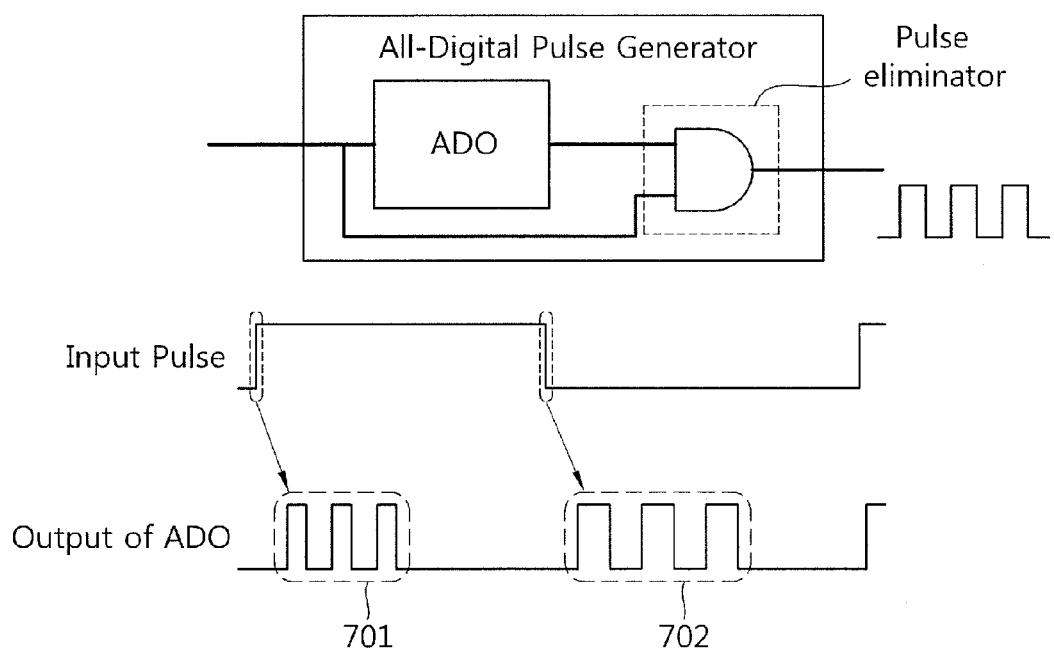
FIG. 7 is a view illustrating another example of the all-digital pulse generator.

FIG. 7 is a view illustrating another example of the all-digital pulse generator.

The all-digital pulse generator illustrated in FIG. 7 additionally includes a pulse eliminator compared with the all-digital pulse generators described above with reference to FIGS. 4 to 6.

The pulse eliminator can be simply implemented as an AND gate, a block for eliminating a fine pulse generated by a falling edge of the pulse input to the all-digital pulse generator.

When a PPM-modulated input pulse passes through the ADO according to an exemplary embodiment of the present invention, two groups (702 and 702) of pulse signals according to rising edges and falling edges are generated. As discussed above, in an exemplary embodiment of the present invention, in consideration of the difficulty in implemented in case of using a low-cost process, one edge, for example, only the rising edge, of the input pulse is used. Thus, the pulse signal group 702 according to the falling edge is not necessary. Thus, the pulse eliminator may be additionally installed to eliminate the pulse signal according to the falling edge. The pulse eliminator eliminates the undesired pulse signal in a self-referencing manner by making the pulse signal input to the ADO and the output signal from the ADO pass through the AND gate. Through this method, only the desired pulse signal can be simply obtained, and this method can be favorably used in generating a burst pulse.

As the present invention may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A pulse generator comprising:
a time delayed pulse generation unit comprising a plurality of delay cells in series for receiving a first pulse having a first pulse width and
outputting pulses from each of the plurality of delays cells delayed by a particular time delay value based on one of a rising edge or a falling edge of the first pulse, and
wherein at least two or more of the plurality of delays cells have particular time delays that vary differently depending on whether the respective particular time delay value was based on either the rising edge and not the falling edge or the falling edge and not the rising edge;
an edge combiner configured to directly receives the plurality of time delayed pulses output each of the plurality of delay cells, and
wherein the edge combiner generates second pulses having a second pulse width; and
a channel selector configured to regulate the number of outputs of the second pulses generated by the edge combiner.

2. The pulse generator of claim 1, wherein the second pulse width is equal to the particular time delay value and smaller than the first pulse width.

3. The pulse generator of claim 1, wherein the delay cells output pulses delayed by the particular time delay value based on the rising edge of the first pulse.

4. The pulse generator of claim 1, further comprising:
a delay control unit configured to regulate the particular time delay value of the delay cells.

5. The pulse generator of claim 4, wherein the delay control unit regulates the particular time delay value by regulating a number of 3-state buffers operating in the respective delay cells comprised in the time delayed pulse generation unit.

6. The pulse generator of claim 1, further comprising:
a pulse elimination unit connected to the edge combiner, wherein the pulse elimination unit receives the second pulses and the first pulse output from the edge combiner and eliminates a pulse generated by an edge other than the edge associated with the rising edge.

7. The pulse generator of claim 1, wherein the second pulse width is equal to at least one of 143 ps (pico seconds), 125 ps, and 111 ps.

8. A pulse generation method comprising:
receiving a first pulse having a first pulse width and outputting a plurality of pulses delayed by a particular time delay value based on one of a rising edge or a falling edge of the first pulse;
receiving the plurality of time delayed pulses and generating second pulses having a second pulse width, and
wherein each of the second pulse widths are generated from the rising edge; and
regulating the number of outputs of the generated second pulses.

9. The method of claim 8, wherein the second pulse width is equal to the particular time delay value and smaller than the first pulse width.

10. The method of claim 8, wherein the time delayed pulses are pulses delayed by the particular time delay value based on the rising edge of the first pulse.

11. The method of claim 8, further comprising:
eliminating a pulse generated by an edge other than the edge associated with the rising edge among the second pulses.

12. The method of claim 8, wherein the second pulse width is equal to at least one of 143 ps (pico seconds), 125 ps, and 111 ps.

13. A pulse generator comprising:
a time delayed pulse generation unit including a plurality of delay cells for receiving a first pulse having a first pulse width and outputting pulses delayed by a particular time delay value based on one of a rising edge or a falling edge of the first pulse, and
wherein the particular time delay value is configured based on a CMOS process being less than 65 nm;
an edge combiner configured to receive the plurality of time delayed pulses from the time delayed pulse generation unit and generate second pulses having a second pulse width; and
a channel selector configured to regulate the number of outputs of the second pulses generated by the edge combiner.

* * * * *